United States Patent
Uchikawa (10) Patent No.: US 9,264,072 B2
(45) Date of Patent: Feb. 16, 2016

(54) ENCODING APPARATUS AND COMMUNICATION APPARATUS

(71) Applicant: Hironori Uchikawa, Fujisawa (JP)

(72) Inventor: Hironori Uchikawa, Fujisawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 152 days.

(21) Appl. No.: 13/727,422

(22) Filed: Dec. 26, 2012

(65) Prior Publication Data

US 2013/0227372 A1 Aug. 29, 2013

(30) Foreign Application Priority Data

Feb. 23, 2012 (JP) .................................. 2012-037397

(51) Int. Cl.
*H03M 13/11* (2006.01)
*H03M 13/13* (2006.01)

(52) U.S. Cl.
CPC .......... *H03M 13/1154* (2013.01); *H03M 13/13* (2013.01)

(58) Field of Classification Search
CPC   H03M 13/116; H03M 13/1154; H03M 13/13
See application file for complete search history.

(56) References Cited

U.S. PATENT DOCUMENTS

| 7,343,539 | B2* | 3/2008 | Divsalar ............ H03M 13/1194 714/755 |
| 7,499,490 | B2* | 3/2009 | Divsalar et al. ............... 375/240 |
| 8,117,523 | B2* | 2/2012 | Divsalar ................ H03M 13/03 714/751 |
| 8,132,072 | B2* | 3/2012 | El-Khamy .......... H03M 13/033 714/755 |
| 8,239,746 | B2* | 8/2012 | Divsalar et al. ................ 714/801 |
| 8,464,123 | B2* | 6/2013 | Alrod ................... G06F 11/1068 714/746 |
| 8,499,218 | B2* | 7/2013 | Yedidia ............... H03M 13/036 714/752 |
| 8,514,914 | B2* | 8/2013 | Yokoo et al. ................... 375/219 |
| 8,595,589 | B2* | 11/2013 | Yedidia et al. ................ 714/758 |
| 8,689,083 | B2* | 4/2014 | Nguyen .............. H03M 13/036 714/774 |
| 2008/0148128 | A1* | 6/2008 | Sharon .............. H03M 13/1131 714/758 |

OTHER PUBLICATIONS

Richter, G.; Kaupper, M.; Zigangirov, K. Sh, "Irregular Low-Density Parity-Check Convolutional Codes Based on Protographs," Information Theory, 2006 IEEE International Symposium on , vol., no., pp. 1633,1637, Jul. 9-14, 2006.*
Applicant-provided Background Art Information Sheet.
Shrinivas Kudekar et al: "Threshold Saturation via Spatial Coupling: Why Convolutional LDPC Ensembles Perform So Well Over the BEC": IEEE Transactions on Information Theory: vol. 57, No. 2: Feb. 2011: pp. 803-834: (in English).

(Continued)

*Primary Examiner* — Steve Nguyen
(74) *Attorney, Agent, or Firm* — Holtz, Holtz & Volek PC (57) ABSTRACT

According to one embodiment, an encoding apparatus includes an encoding unit. The encoding unit encodes a data bit sequence to generate a codeword corresponding to a parity check matrix. The parity check matrix is based on a protograph. In the protograph, each of n check nodes of a first type is connected to n variable nodes of a first type by a total of at least one edge of a first type, and to n variable nodes of a second type by a total of at least two edges of a second type. In the protograph, each of n check nodes of a second type is connected to the n variable nodes of the second type by a total of r edges of a third type, and to n variable nodes of a third type by a total of g edges of a fourth type.

18 Claims, 4 Drawing Sheets

(56) References Cited

OTHER PUBLICATIONS

Kenta Kasai et al: "Spatially-Coupled MacKay-Neal codes and Hsu-Anastasopoulos codes": IEEE International Symposium on Information Theory Proceedings: Aug. 2011: pp. 752-756: (in English).

J. Thorpe: "Low-Density Parity-Check (LDPC) Codes Constructed from Protographs": IPN Progress Report 42-154: Aug. 15, 2003: pp. 1-7: (in English).

Extended European Search Report (EESR) dated Apr. 4, 2013 (in English) issued in counterpart European Application No. 12199353.9.

A. Eslami et al: "A Practical Approach to Polar Codes": XP-002694158: 2011 IEEE International Symposium on Information Theory Proceedings: pp. 16-20 (in English).

Alberto Jimenez Felstrom et al.: "Time-Varying Periodic Convolutional Codes With Low-Density Parity-Check Matrix": XP-002694160: IEEE Transactions on Information Theory: vol. 45, No. 6, Sep. 1999: pp. 2181-2191 (in English).

* cited by examiner

ENCODING APPARATUS AND COMMUNICATION APPARATUS

CROSS-REFERENCE TO RELATED APPLICATIONS

This application is based upon and claims the benefit of priority from Japanese Patent Application No. 2012-037397, filed Feb. 23, 2012, the entire contents of which are incorporated herein by reference.

FIELD

Embodiments described herein relate generally to error correction coding.

BACKGROUND

Spatially-coupled low-density parity check (LDPC) codes have been developed based on a method for constructing an LPDC convolutional code. Specifically, the spatially-coupled LDPC code is defined by a spatially-coupled protograph. The spatially-coupled protograph is formed by coupling protographs for a plurality of regular LDPC codes. The performance limit of the spatially-coupled LDPC code during iterative decoding (that is, belief propagation [BP] decoding) reaches the maximum likelihood decoding performance of a regular LDPC code that forms the corresponding spatially-coupled protograph. Here, the maximum likelihood decoding performance of the regular LDPC code asymptotically approaches a Shannon limit (that is, a theoretical limit) with increasing the degree of the corresponding check node (that is, a row weight on the corresponding parity check matrix). Namely, the iterative decoding performance of the spatially-coupled LDPC code based on the regular LDPC code with the check node degree being set to a very large value can be made to asymptotically approach the Shannon limit. On the other hand, the computational complexity per iteration during iterative decoding is generally proportional to the check node degree. Hence, the computational complexity significantly increases when the iterative decoding performance of the spatially-coupled LDPC code is made to asymptotically approach the Shannon limit.

Furthermore, Mackay-Neal (MN) codes and Hsu-Anastasopoulos (HA) codes are expected to have their maximum likelihood performance asymptotically approach the Shannon limit. For spatially-coupled MN codes and spatially-coupled HA codes based on the MN codes and HA codes, the iterative decoding performance on a binary erasure channel has been numerically demonstrated to asymptotically approach the Shannon limit. Here, the check node degree for the MN code and the HA code is given as a constant. The constant is smaller than the check node degree that is set to make the maximum likelihood decoding performance of the regular LDPC code asymptotically approach the Shannon limit. Hence, compared to the above-described spatially-coupled LDPC code based on the regular LDPC code, the spatially-coupled MN code and the spatially-coupled HA code enable a reduction in the computational complexity if the iterative decoding performance is made to asymptotically approach the Shannon limit. However, both the spatially-coupled MN code and the spatially-coupled HA code are non-systematic codes, a data bit sequence cannot be taken out from a codeword bit sequence unless a decoding process is carried out on these codes.

DETAILED DESCRIPTION

Embodiments will be described below with reference to the drawings.

In general, according to one embodiment, an encoding apparatus includes an encoding unit. The encoding unit encodes a data bit sequence to generate a codeword corresponding to a parity check matrix. The parity check matrix matches a matrix obtained by performing a copy and permutation operation on a spatially-coupled matrix. The spatially-coupled matrix includes a plurality of first matrices arranged in a diagonal direction. Each of the plurality of first matrices includes a plurality of expanded matrices coupled together in a row direction. A summation of the plurality of expanded matrices is equal to a fundamental matrix. The fundamental matrix corresponds to a protograph including n (n denotes an integer of at least 1) check nodes of a first type, n check nodes of a second type, n variable nodes of a first type, n variable nodes of a second type, n variable nodes of a third type, at least n edges of a first type, at least 2n edges of a second type, rn (r denotes an integer of at least 3) edges of a third type, and gn (g denotes an integer of at least 2) edges of a fourth type. In the protograph, each of the n check nodes of the first type is connected to the n variable nodes of the first type by a total of at least one edge of the first type, and to the n variable nodes of the second type by a total of at least two edges of the second type. In the protograph, each of the n check nodes of the second type is connected to the n variable nodes of the second type by a total of r edges of the third type, and to the n variable nodes of the third type by a total of g edges of the fourth type. In the protograph, each of the n variable nodes of the first type is connected to the n check nodes of the first type by a total of at least one edge of the first type. In the protograph, each of the n variable nodes of the second type is connected to the n check nodes of the first type by a total of at least two edges of the second type, and to the n check nodes of the second type by a total of r edges of the third type. In the protograph, each of the n variable nodes of the third type is connected to the n check nodes of the second type by a total of g edges of the fourth type.

Elements that are the same as or similar to those which have been described are denoted by the same or similar reference numerals, and duplicate descriptions are basically omitted. The characteristics of a parity check matrix does not change if elementary row operation and elementary column operation are performed on the parity check matrix. Thus, a second parity check matrix that can be derived by optionally performing an elementary row operation and an elementary column operation on a first parity check matrix is considered to be the same as the first parity check matrix.

First Embodiment

An encoding apparatus and a decoding apparatus according to the first embodiment carry out error correction encoding and error correction decoding. The encoding apparatus and the decoding apparatus are incorporated into, for example, a storage system or a communication system. Specifically, the encoding apparatus and the decoding apparatus may be applied to any systems such as a nonvolatile semiconductor storage system, a communication system, an optical recording system, and a magnetic recording system for which error correction coding can be utilized.

The error correction encoding according to the present embodiment is, for example, what is called spatially-coupled LDPC codes. The spatially-coupled LDPC code is a variable length LDPC code which is defined by a parity check matrix. The parity check matrix is generally defined by a protograph (that is, a bipartite graph) or a fundamental matrix (=B) that is the protograph expressed in matrix form. The encoding apparatus according to the present embodiment generates codewords corresponding to the parity check matrix. The codewords corresponding to the parity check matrix mean codewords that become zero vector when multiplied by the parity check matrix.

The fundamental matrix is an $m_p$ rows×$n_p$ columns non-zero matrix. The fundamental matrix is expanded into 1+d expanded matrices (=$B_0, \ldots, B_d$) for use. Here, d denotes an integer of at least 1. $B_0$ and $B_d$ are non-zero matrices, but some or all of the other matrices $B_1, \ldots, B_{d-1}$ may be zero matrices. The fundamental matrix is equal to a summation of 1+d expanded matrices as indicated below by Equation (1). In other words, the 1+d expanded matrices correspond to partial protographs into which the protograph corresponding to the fundamental matrix is divided.

$$B = \sum_{i=0}^{d} B_i \quad (1)$$

Then, a spatially-coupled matrix $B_{[1, L]}$ can be derived as indicated below by Equation (2) by diagonally arranging L non-zero matrices with (1+d)$m_p$ rows×$n_p$ columns. Each of the non-zero matrices includes 1+d expanded matrices coupled together in a row direction. The diagonally arranged L non-zero matrices may be referred to as a band matrix. Here, L denotes a parameter that determines the codeword length of a spatially-coupled LPDC code. L denotes an integer of at least 2. In the description below, if 0 is described as an element of a matrix or a vector, 0 may simply mean zero or may mean a zero matrix or a zero vector.

$$B_{[1,L]} = \begin{bmatrix} B_0 & 0 & \cdots & 0 & 0 \\ \vdots & B_0 & \ddots & \vdots & \vdots \\ B_d & \vdots & \ddots & 0 & 0 \\ 0 & B_d & \ddots & B_0 & 0 \\ \vdots & 0 & \ddots & \vdots & B_0 \\ \vdots & \vdots & \ddots & B_d & \vdots \\ 0 & 0 & \cdots & 0 & B_d \end{bmatrix} \in (Z^+)^m p^{(L+d)\times n_p L} \quad (2)$$

A parity check matrix for a spatially-coupled LDPC code can be derived by performing a copy and permutation operation described below on a spatially-coupled matrix (=B [1, L]) shown in Equation (2). A fundamental matrix and its expanded matrices represent the corresponding protographs. Thus, $B_{[1, L]}$ can be treated as spatially-coupled protographs expressed in matrix form. Furthermore, an LDPC code defined by a parity check matrix based on a protograph is referred to as a protograph LDPC code. The spatially-coupled LDPC code can be treated as a type of protograph LPDC code.

Figure 2:
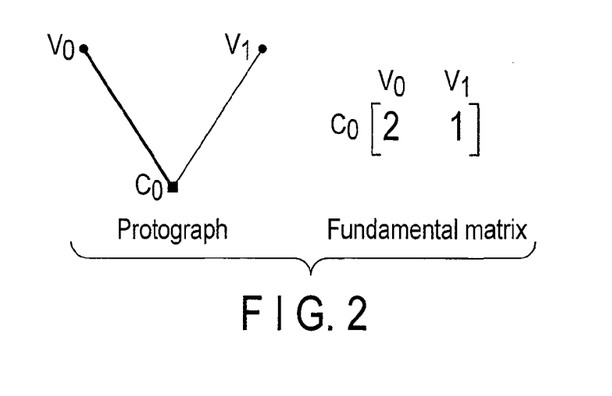
FIG. 2 is a diagram illustrating a protograph and a fundamental matrix.

As described above, a fundamental matrix is a protograph expressed in matrix form. Specifically, as shown in FIG. 2, a row index of the fundamental matrix identifies the type of a check node. A column index of the fundamental matrix identifies the type of a variable node. Each element identifies the number of edges connecting the check node and the variable node identified by the row index and the column index, respectively. If the element is non-zero, the type of the edges may be defined for the non-zero element. In the example in FIG. 2, the element in the first row and the first column is 2, and thus the check node (=$C_0$) of the first type (row index=1) and the variable node (=$V_0$) of the first type (column index=1) are connected by two edges of the first type. Furthermore, the element in the first row and the second column is 1, and thus the check node (=$C_0$) of the first type and the variable node (=$V_1$) of the second type (column index=2) are connected by one edge of the second type.

Figure 3:
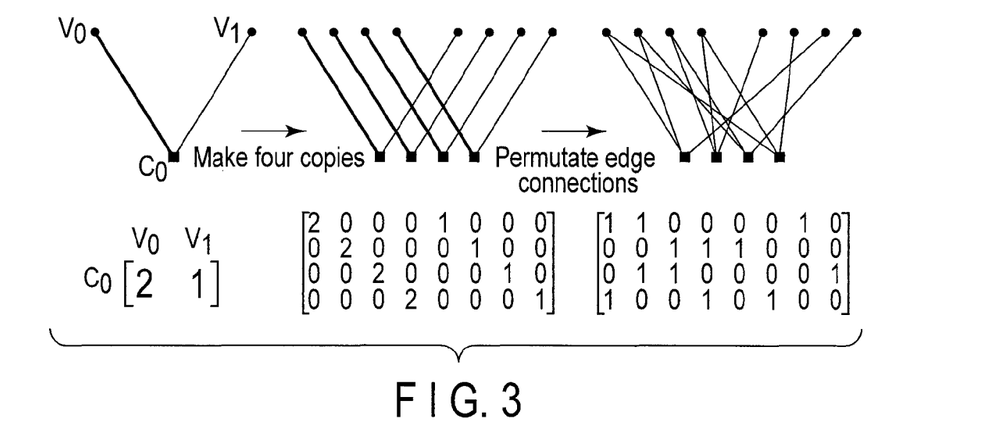
FIG. 3 is a diagram illustrating a copy and permutation operation.

The copy and permutation operation is described in the document J. Thorpe, "Low Density Parity Check (LDPC) Codes Constructed from Protographs," JPL IPN Progress Report 42-154, August 2003, in detail and will be described below in brief. As shown in FIG. 3, an operation of copying and permutating a fundamental matrix (or protograph) includes an operation of making Z (in the example in FIG. 3, four) copies of the fundamental matrix and an operation of permutating the edge connections in the Z copies of the fundamental matrix. Z denotes a parameter indicative of the number of copies and is an integer of at least 2. The permutation operation needs to be performed with the structure of protographs maintained. Specifically, the number of edges connecting each check node and each variable node needs to remain unchanged throughout the permutation operation. In other words, the types of the check node and the variable node connected together by each edge need to remain unchanged throughout the permutation operation.

In the example in FIG. 3, the following structure is maintained throughout the permutation operation. (1) Any one of the check nodes of the first type (row index=1, 2, 3, 4) and the variable nodes of the first type (column index=1, 2, 3, 4) are connected together by a total of two edges. (2) Any one of the check nodes of the first type and the variable nodes of the second type (column index=5, 6, 7, 8) are connected together by a total of one edge. (3) Any one of the variable nodes of the first type and the check nodes of the first type are connected together by a total of two edges. (4) Any one of the variable nodes of the second type and the check nodes of the first type are connected together by a total of one edge.

Performing cyclic permutation as a permutation operation in the copy and permutation operation allows a quasi-cyclic LDPC code to be constructed. The quasi-cyclic LDPC code can be relatively easily implemented.

As described above, in connection with spatially-coupled LDPC codes, the copy and permutation operation is performed on a spatially-coupled matrix (=B [1, L]) based on a fundamental matrix (=B). The fundamental matrix will be described below.

The fundamental matrix used in the present embodiment is shown in, for example, Equation (3). Alternatively, the fundamental matrix may be derived by performing a copy and permutation operation on the matrix shown in Equation (3). In such a case, as described below, the numbers of check nodes, variable nodes, and edges of the same types increase with increasing the number of copies. For example, generalization with the number of copies denoted by n (n=1 [no copy and permutation operation], 2, . . . ), the numbers of check nodes, variable nodes, and edges of the same types are multiplied by n.

$$B^{(k,r,g,e)} = \begin{bmatrix} 1 & 0 & 2 & 0 \\ 0 & E & A & D \end{bmatrix} \in (Z^+)^{(1+k)\times(2+e+k)} \quad (3)$$

In Equation (3), k, r, g, and e denote configurable parameters. k denotes an integer of at least 1. r denotes an integer of at least 3. g denotes an integer of at least 2. e denotes an integer of at least 0. In the fundamental matrix shown in Equation (3), the element 1 in the first row and the first column and the element 2 in the first row and the 2+e$^{th}$ column are illustrative and may each be replaced with a larger integer. However, in view of a reduction in the computational complexity required for encoding, each element of the fundamental matrix is preferably small.

A matrix E in Equation (3) shown above is a k rows×e columns matrix as shown below in Equation (4). All the elements of the matrix E are r. For e=0, the matrix E is not present.

$$E = \begin{bmatrix} r & \cdots & r \\ \vdots & \ddots & \vdots \\ r & \cdots & r \end{bmatrix} \in (Z^+)^{k \times e} \quad (4)$$

A matrix A in Equation (3) shown above is a k rows×1 column matrix (that is, a column vector) as shown below in Equation (5). All the elements of the matrix A are r.

$$A = \begin{bmatrix} r \\ \vdots \\ r \end{bmatrix} \in (Z^+)^{k \times 1} \quad (5)$$

A matrix D in Equation (3) shown above is a k rows×k columns matrix as shown below in Equation (6). The matrix D includes diagonal elements that are all g and non-diagonal elements that are all zero.

$$D = \begin{bmatrix} g & 0 & \cdots & 0 & 0 \\ 0 & g & \ddots & \vdots & \vdots \\ \vdots & 0 & \ddots & 0 & \vdots \\ \vdots & \vdots & \ddots & g & 0 \\ 0 & 0 & \cdots & 0 & g \end{bmatrix} \in (Z^+)^{k \times k} \quad (6)$$

In the fundamental matrix (=B) in Equation (3) shown above, the first column to the 1+e$^{th}$ column from the left end of the fundamental matrix correspond to data bits. The 2+e$^{th}$ column to the 2+e+k$^{th}$ column from the left end of the fundamental matrix correspond to parity bits. The 2+e$^{th}$ column from the left end of the fundamental matrix corresponds to a punctured bit for the parity check matrix obtained by a copy and permutation operation. As described below, the punctured bit is not supplied to the outside of the encoding apparatus (for example, to a communication channel or a storage medium). Thus, the coding rate of a protograph LDPC code based on the fundamental matrix can be expressed by:

$$R^{(k,r,g,e)} = \frac{1+e}{1+e+k} \quad (7)$$

As described above, in Equation (3) shown above, k, r, g, and e are configurable parameters. Setting k, r, g, and e to various values allows a desired fundamental matrix to be designed. For example, if k=1, r=3, g=2, and e=0, a fundamental matrix shown in Equation (8) can be obtained.

$$B^{(k=1,r=3,g=2,e=0)} = \begin{bmatrix} 1 & 2 & 0 \\ 0 & r & g \end{bmatrix} \quad (8)$$
$$= \begin{bmatrix} 1 & 2 & 0 \\ 0 & 3 & 2 \end{bmatrix}$$

Figure 4:
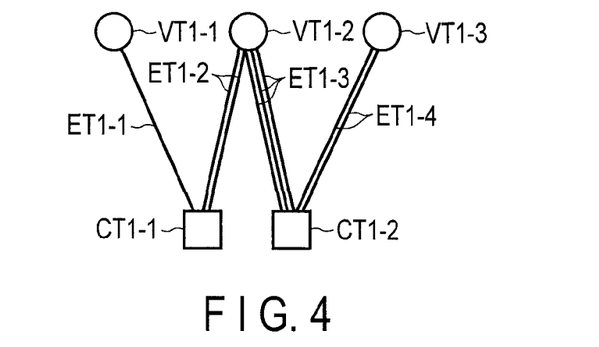
FIG. 4 is a diagram illustrating a protograph.

FIG. 4 shows a protograph corresponding to the fundamental matrix in Equation (8). The first row and the first column of the fundamental matrix indicates that a check node CT1-1 of a first type (row index=1) and a variable node VT1-1 of the first type (column index=1) are connected together by an edge ET1-1 of the first type. The first row and the second column of the fundamental matrix indicates that the check node CT1-1 of the first type and a variable node VT1-2 of a second type (column index=2) are connected together by two edges ET1-2 of the second type. The second row and the second column of the fundamental matrix indicates that the check node CT1-2 of the second type (row index=2) and the variable node VT1-2 of the second type are connected together by three (=r) edges ET1-3 of a third type. The second row and the third column of the fundamental matrix indicates that the check node CT1-2 of the second type and a variable node VT1-3 of the third type (column index=3) are connected together by two (=g) edges ET1-4 of a fourth type.

Furthermore, if k=2, r=3, g=2, and e=0, a fundamental matrix shown in Equation (9) can be obtained.

$$B^{(k=2,r=3,g=2,e=0)} = \begin{bmatrix} 1 & 2 & 0 & 0 \\ 0 & r & g & 0 \\ 0 & r & 0 & g \end{bmatrix} \quad (9)$$
$$= \begin{bmatrix} 1 & 2 & 0 & 0 \\ 0 & 3 & 2 & 0 \\ 0 & 3 & 0 & 2 \end{bmatrix}$$

Figure 5:
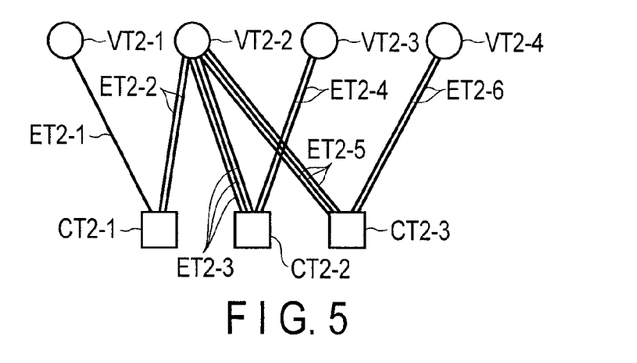
FIG. 5 is a diagram illustrating a protograph.

FIG. 5 shows a protograph corresponding to the fundamental matrix in Equation (9). The first row and the first column of the fundamental matrix indicates that a check node CT2-1 of a first type (row index=1) and a variable node VT2-1 of the first type (column index=1) are connected together by an edge ET2-1 of the first type. The first row and the second column of the fundamental matrix indicates that the check node CT2-1 of the first type and a variable node VT2-2 of a second type (column index=2) are connected together by two edges ET2-2 of the second type. The second row and the second column of the fundamental matrix indicates that the check node CT2-2 of the second type (row index=2) and the variable node VT2-2 of the second type are connected together by three (=r) edges ET2-3 of a third type. The second row and the third column of the fundamental matrix indicates that the check node CT2-2 of the second type and a variable node VT2-3 of the third type (column index=3) are connected together by two (=g) edges ET2-4 of a fourth type. The third row and the second column of the fundamental matrix indicates that the check node CT2-3 of the third type (row index=3) and the variable node VT2-2 of the second type are connected together by three (=r) edges ET2-5 of a fifth type. The third row and the fourth column of the fundamental matrix indicates that the check node CT2-3 of the third type and the variable node VT2-4 of the fourth type (column index=4) are connected together by two (=g) edges ET2-6 of a sixth type.

Furthermore, if k=1, r=3, g=2, and e=1, a fundamental matrix shown in Equation (10) can be obtained.

$$B^{(k=1,r=3,g=2,e=1)} = \begin{bmatrix} 1 & 0 & 2 & 0 \\ 0 & r & r & g \end{bmatrix} \quad (10)$$
$$= \begin{bmatrix} 1 & 0 & 2 & 0 \\ 0 & 3 & 3 & 2 \end{bmatrix}$$

Figure 6:
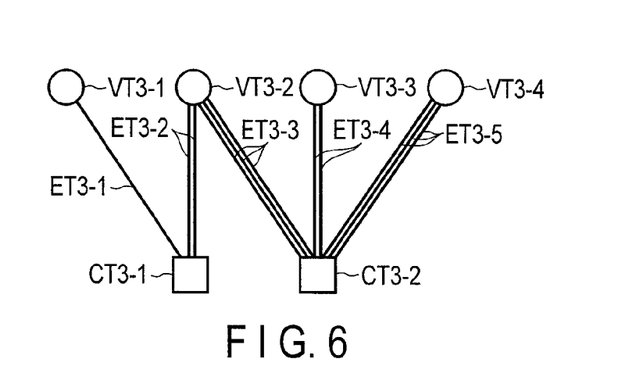
FIG. 6 is a diagram illustrating a protograph.

FIG. 6 shows a protograph corresponding to the fundamental matrix in Equation (10). The first row and the first column of the fundamental matrix indicates that a check node CT3-1 of a first type (row index=1) and a variable node VT3-1 of the first type (column index=1) are connected together by an edge ET3-1 of the first type. The first row and the third column of the fundamental matrix indicates that the check node CT3-1 of the first type and a variable node VT3-2 of a second type (column index=3) are connected together by two edges ET3-2 of the second type. The second row and the second column of the fundamental matrix indicates that the check node CT3-2 of the second type (row index=2) and a variable node VT3-4 of a fourth type (column index=2) are connected together by three (=r) edges ET3-5 of a fifth type. The second row and the third column of the fundamental matrix indicates that the check node CT3-2 of the second type and a variable node VT3-2 of the second type are connected together by three (=r) edges ET3-3 of a third type. The second row and the fourth column of the fundamental matrix indicates that the check node CT3-2 of the second type and a variable node VT3-3 of the third type (column index=4) are connected together by two (=g) edges ET3-4 of a fourth type.

The fundamental matrix designed as described above (=B) is expanded into 1+d expanded matrices (=$B_0, \ldots, B_d$). An example of expansion for d=1 will be described below. However, any technique may be used to expand the fundamental matrix into 1+d expanded matrices. Equation (3) described above allows Equation (11) shown below to hold true for d=1.

$$B_0^{(k,r,g,e)} = B^{(k,r,g,e)} - B_1^{(k,r,g,e)} \quad (11)$$

In the present example, $B_1$ denotes an expanded matrix shown in:

$$B_1^{(k,r,g,e)} = \begin{bmatrix} 0 & 0 & 0 & 0 \\ 0 & 0 & V & I \end{bmatrix} \in (Z^+)^{(1+k) \times (2+e+k)} \quad (12)$$

In Equation (12), a matrix I is a k rows×k columns identity matrix. A matrix V is a k rows×1 column matrix (that is, a column vector) as shown in Equation (13). All the elements of the matrix V are 1.

$$V = \begin{bmatrix} 1 \\ \vdots \\ 1 \end{bmatrix} \in (Z^+)^{k \times 1} \quad (13)$$

Equations (2) and (11) shown above allow a spatially-coupled matrix to be expressed by:

$$B_{[1,L]}^{(k,r,g,e)} = \begin{bmatrix} B_0 & 0 & \cdots & 0 & 0 \\ B_1 & B_1 & \ddots & \vdots & \vdots \\ 0 & B_1 & \ddots & 0 & \vdots \\ \vdots & 0 & \ddots & B_0 & 0 \\ \vdots & \vdots & \ddots & B_1 & B_0 \\ 0 & 0 & \cdots & 0 & B_1 \end{bmatrix} \in (Z^+)^{(1+k)(L+1) \times (2+e+k)L} \quad (14)$$

In the spatially-coupled matrix, L columns corresponding to the 2+$e^{th}$ columns from the left end of the fundamental matrix, that is, the 2+$e^{th}$ column, the 2+e+(2+e+k)$^{th}$ column, ..., the 2+e+(L-1)(2+e+k)$^{th}$ column correspond to punctured bits. Thus, the coding rate of a spatially-coupled LDPC code based on the spatially-coupled matrix in Equation (14) can be expressed by:

$$R_L^{(k,r,g,e)} = \frac{(2+e+k)L - (1+k)L - k}{(1+e+k)L} \quad (15)$$
$$= R^{(k,r,g,e)} - \frac{k}{(1+e+k)L}$$

As shown in Equation (15), the coding rate of the spatially-coupled LDPC code based on the spatially-coupled matrix in Equation (14) shown above is lower than that of the protograph LDPC code based on the fundamental matrix (see Equation (7)). However, the decrease in coding rate k/(1+e+k)L can be made closer to zero by increasing L.

Performing a copy and permutation operation on the spatially-coupled matrix in Equation (14) shown above allows derivation of a parity check matrix that defines a spatially-coupled LDPC code. The parity check matrix (=H) can be expressed by:

$$H = \begin{bmatrix} H_0^{(1)} & 0 & \cdots & 0 & 0 \\ H_1^{(1)} & H_0^{(2)} & \ddots & \vdots & \vdots \\ 0 & H_1^{(2)} & \ddots & 0 & \vdots \\ \vdots & 0 & \ddots & H_0^{(L-1)} & 0 \\ \vdots & \vdots & \ddots & H_1^{(L-1)} & H_0^{(L)} \\ 0 & 0 & \cdots & 0 & H_1^{(L)} \end{bmatrix} \in \{0,1\}^{(1+k)(L+1)Z \times (2+e+k)LZ} \quad (16)$$

In Equation (16), Z denotes the number of copies. The parity check matrix in Equation (16) is obtained by diagonally arranging L non-zero matrices with 2(1+k)Z rows×(2+e+k)Z columns. Each of the non-zero matrices includes two non-zero matrices (=$H_0^{(l)}$, $H_1^{(l)}$) coupled together in the row direction. The diagonally arranged L non-zero matrices may be referred to as a band matrix. Here, l is an integer of at least 1 and at most L and denotes a section corresponding to the column position of a non-zero matrix in the parity check matrix.

In Equation (16), $H_0^{(l)}$ denotes a matrix obtained by performing a copy and permutation operation on $B_0$. Similarly, $H_1^{(l)}$ denotes a matrix obtained by performing a copy and permutation operation on $B_1$. As also shown in FIG. 2, the permutation has a certain degree of freedom. Thus, even with the same number of copies, various non-zero matrices can be obtained from the same expanded matrix. Consequently, $H_0^{(l)}$ may vary depending on the section or may be the same for a plurality of sections. Similarly, $H_1^{(l)}$ may vary depending on the section or may be the same for a plurality of sections. $H_0^{(l)}$ may be expressed by Equation (17) shown below. $H_1^{(l)}$ may be expressed by Equation (18) shown below.

$$H_0^{(l)} = \begin{bmatrix} I & 0 & C^{(l)} & 0 \\ 0 & E^{(l)} & A^{(l)} & F^{(l)} \end{bmatrix} \in \{0, 1\}^{(1+k)Z \times (2+e+k)Z} \quad (17)$$

$$H_1^{(l)} = \begin{bmatrix} 0 & 0 & 0 & 0 \\ 0 & 0 & P^{(l)} & Q^{(l)} \end{bmatrix} \in \{0, 1\}^{(1+k)Z \times (2+e+k)Z} \quad (18)$$

Submatrices shown in Equation (17) are obtained by performing a copy and permutation operation on each submatrix of $B_0$. For example, $E \rightarrow E^{(l)}$, $(A-V) \rightarrow A^{(l)}$, and $(D-I) \rightarrow F^{(l)}$. For simplification of description, $H_0^{(l)}$ shown in Equation (17) is partly formed of Z rows×Z columns identity matrix I. However, whatever copy and permutation operation is used to obtain a parity check matrix, the parity check matrix in Equation (17) is obtained by an elementary row operation, preventing generality from being lost. Each of the submatrices shown in Equation (18) is obtained by performing a copy and permutation operation on each submatrix of $B_1$. For example, $V \rightarrow P^{(l)}$.

The encoding apparatus according to the present embodiment generates spatially-coupled LDPC codewords defined, for example, by the parity check matrix in Equation (16) shown above. In the description below, for simplification, it is assumed that k=1+e. Furthermore, for all the sections, the submatrices $C^{(l)}$ and $F^{(l)}$ are assumed to be full rank. Moreover, a matrix shown in Equation (19) is also assumed to be full rank.

$$\begin{bmatrix} I & 0 & C^{(L)} & 0 \\ 0 & E^{(L)} & A^{(L)} & F^{(L)} \\ 0 & 0 & P^{(L)} & Q^{(L)} \end{bmatrix} \quad (19)$$

The matrix in Equation (19) is included in a submatrix corresponding to the $L^{th}$ section of the parity check matrix in Equation (16) shown above and corresponds to the submatrix from which rows comprising only zero elements, which do not contribute to generation of parity bits, are omitted. Even if some or all of these conditions fail to be met, the encoding apparatus according to the present embodiment can be implemented by appropriately modifying matters described below.

In the encoding apparatus according to the present embodiment, an operation performed on the first section to the $L-1^{th}$ section is different from an operation performed on the $L^{th}$ section. For each of the first section to the $L-1^{th}$ section, the encoding apparatus inputs a data bit sequence and generates a parity bit sequence for the corresponding section. On the other hand, for the $L^{th}$ section, the encoding apparatus generates a parity bit sequence for the $L^{th}$ section without inputting any data bit sequence.

The encoding apparatus generates a parity bit sequence ($=v^{(l)}, w^{(l)}$) for the $1^{th}$ section ($1 \leq l \leq L-1$) from a data bit sequence ($=u_1^{(l)}, u_2^{(l)}$) for the $1^{th}$ section. Each data bit sequence has a length of (1+e)Z bits. Each parity bit sequence has a length of (1+k)Z bits. Specifically, the first data bit sequence ($=u_1^{(l)}$) for the $1^{th}$ section has a length of Z bits. The second data bit sequence ($=u_2^{(l)}$) for the $1^{th}$ section has a length of eZ bits. A punctured parity bit sequence ($=v^{(l)}$) for the $1^{th}$ section has a length of Z bits. An output parity bit sequence ($=w^{(l)}$) for the $1^{th}$ section has a length of kZ bits. Among these bit sequences, the punctured parity bit sequence is not included in the output bit sequence and not supplied to the outside of the encoding apparatus. That is, the output bit sequence for the $1^{th}$ section is ($u_1^{(l)}, u_2^{(l)}, w^{(l)}$). Each output bit sequence has a length of (1+e+k)Z (=2kZ) bits.

In accordance with Equation (20) shown below, the encoding apparatus can generate a punctured parity bit sequence ($=v^{(1)}$) for the first section based on a first data bit sequence ($=u_1^{(1)}$) for the first section. In the description below, various bit sequences are treated as row vectors. Furthermore, T added to vectors or matrices indicates transposition; −1 added to matrices indicates an inverse matrix.

$$v^{(1)} = (C^{(1)})^{-1}(u_1^{(1)})^T \quad (20)$$

In accordance with Equation (21) shown below, the encoding apparatus can generate an output parity bit sequence ($=w^{(1)}$) for the first section based on a second data bit sequence ($=u_2^{(1)}$) and the punctured parity bit sequence ($=v^{(1)}$) for the first section.

$$w^{(1)} = (F^{(1)})^{-1}(E^{(1)}, A^{(1)})(u_2^{(1)}, v^{(1)})^T \quad (21)$$

In accordance with Equation (22) shown below, the encoding apparatus can generate a punctured parity bit sequence ($=v^{(l)}$) for the $1^{th}$ section based on the first data bit sequence ($=u_1^{(l)}$) for the $1^{th}$ section ($2 \leq l \leq L-1$).

$$v^{(l)} = (C^{(l)})^{-1}(u_1^{(l)})^T \quad (22)$$

In accordance with Equation (23) shown below, the encoding apparatus can generate an output parity bit sequence ($=w^{(l)}$) for the $1^{th}$ section based on a punctured parity bit sequence ($=v^{(l-1)}$) and an output parity bit sequence ($=w^{(l-1)}$) for the $l-1^{th}$ section ($2 \leq l \leq L-1$) and a second data bit sequence ($=u_2^{(l)}$) and a punctured parity bit sequence ($=v^{(l)}$) for the $1^{th}$ section.

$$w^{(l)} = (F^{(l)})^{-1}(P^{(l-1)}, Q^{(l-1)}, E^{(l)}, A^{(l)})(v^{(l-1)}, w^{(l-1)}, u_2^{(l)}, v^{(l)})^T \quad (23)$$

As indicated by Equation (23), the punctured parity bit sequence and output parity bit sequence for the $l-1^{th}$ section are required to generate the output parity bit sequence for the $1^{th}$ section. That is, in this spatially-coupled LDPC code, output parity bit sequences are generated through sequential calculations.

For the $L^{th}$ section, the encoding apparatus generates a parity bit sequence ($=w_1^{(L)}, v^{(L)}, w_2^{(L)}$) without inputting any data bit sequence. A parity bit sequence for the $L^{th}$ section has a length of (1+2k)Z bits. Specifically, a first output parity bit sequence ($=w_1^{(L)}$) for the $L^{th}$ section has a length of kZ bits. A punctured parity bit sequence ($=v^{(L)}$) for the $L^{th}$ section has a length of Z bits. A second output parity bit sequence ($=w_2^{(L)}$) for the $L^{th}$ section has a length of kZ bits. Among these bit sequences, the punctured parity bit sequence is not included in the output bit sequence and not supplied to the outside of the encoding apparatus. That is, the output bit sequence for the $L^{th}$ section is ($w_1^{(L)}, w_2^{(L)}$). The output bit sequence for the $L^{th}$ section has a length of (k+k)Z (=2kZ) bits.

In accordance with Equations (24) and (25) shown below, the encoding apparatus can generate a first output parity bit sequence ($=w_1^{(L)}$), a punctured parity bit sequence ($=v^{(L)}$), and a second output parity bit sequence ($=w_2^{(L)}$) for the $L^{th}$ section based on a punctured parity bit sequence ($=v^{(L-1)}$) and an output parity bit sequence ($=w^{(L-1)}$) for the $L-1^{th}$ section.

$$(w_1^{(L)}, v^{(L)}, w_2^{(L)})^T = \begin{bmatrix} I & 0 & C^{(L)} & 0 \\ 0 & E^{(L)} & A^{(L)} & F^{(L)} \\ 0 & 0 & P^{(L)} & Q^{(L)} \end{bmatrix}^{-1} (0, s^{(L-1)}, 0)^T \quad (24)$$

$$s^{(L-1)} = (P^{(L-1)}, Q^{(L-1)})(v^{(L-1)}, w^{(L-1)})^T \quad (25)$$

Codeword bit sequences $(=c^{(0)}, c^{(1)}, \ldots, c^{(L)})$ for the first section to the $L^{th}$ sections generated as described above satisfy Equation (26) shown below. As described above, for $1 \le l \le L-1$, $c^{(l)} = (u_1^{(l)}, u_2^{(l)}, v^{(l)}, w^{(l)})$ and $c^{(L)} = (w_1^{(L)}, v^{(L)}, w_2^{(L)})$. That is, the encoding apparatus according to the present embodiment achieves systematic coding.

$$\begin{bmatrix} H_0^{(1)} & 0 & \cdots & 0 & 0 \\ H_1^{(1)} & H_0^{(2)} & \ddots & \vdots & \vdots \\ 0 & H_1^{(2)} & \ddots & 0 & \vdots \\ \vdots & 0 & \ddots & H_0^{(L-1)} & 0 \\ \vdots & \vdots & \ddots & H_1^{(L-1)} & H_0^{(L)} \\ 0 & 0 & \cdots & 0 & H_1^{(L)} \end{bmatrix} (c^{(1)}, c^{(2)}, \ldots, c^{(L)})^T = 0 \quad (26)$$

Figure 1:
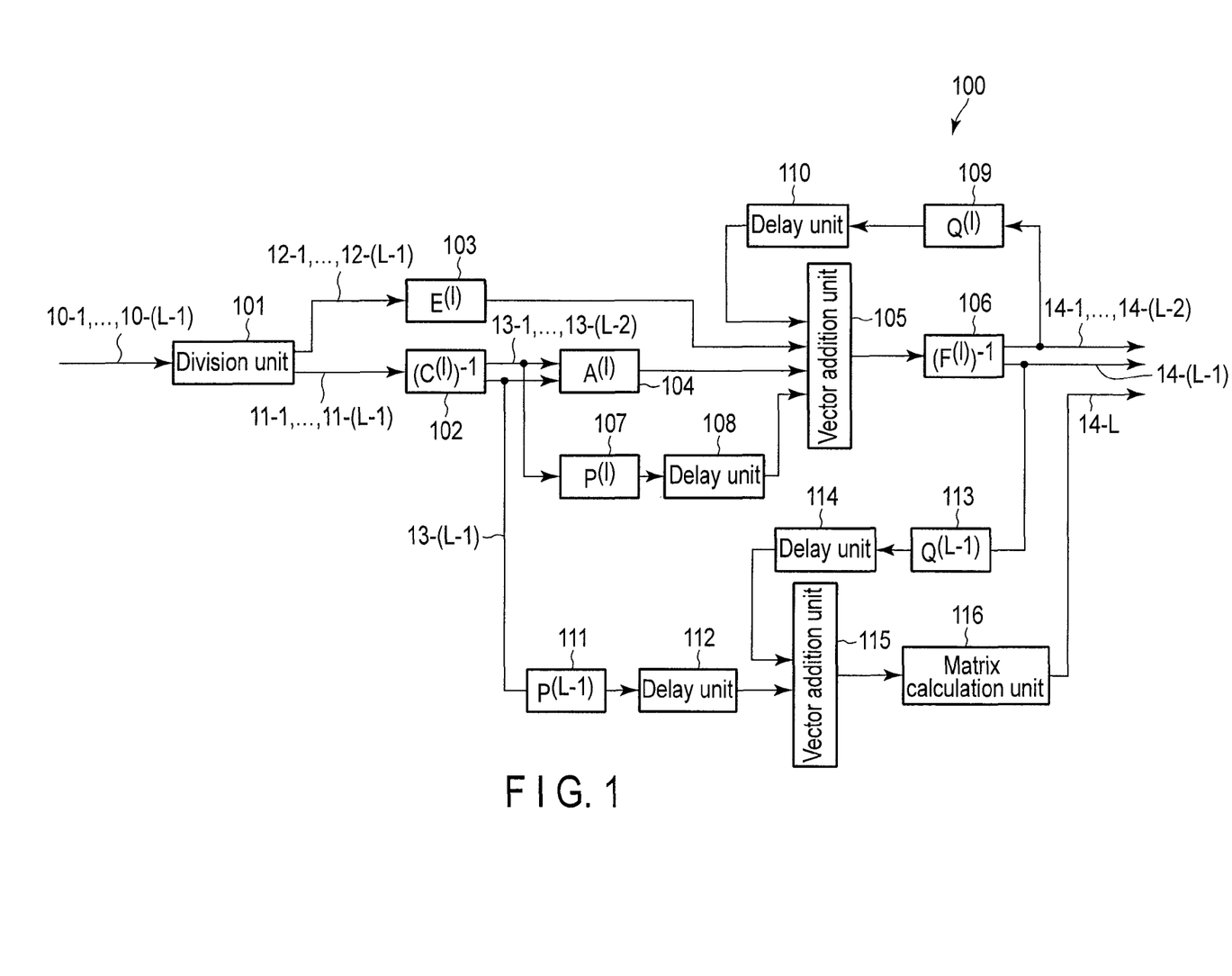
FIG. 1 is a block diagram illustrating an encoding apparatus according to a first embodiment.

An encoding apparatus 100 shown in FIG. 1 generates a codeword bit sequence $(=c^{(0)}, c^{(1)}, \ldots, c^{(L)})$ for the first section to the $L^{th}$ section. The encoding apparatus in FIG. 1 comprises a division unit 101, matrix calculation units 102, 103, and 104, a vector addition unit 105, matrix calculation units 106 and 107, a delay unit 108, a matrix calculation unit 109, a delay unit 110, a matrix calculation unit 111, a delay unit 112, a matrix calculation unit 113, a delay unit 114, a vector addition unit 115, and a matrix calculation unit 116.

For the $1^{th}$ section ($1 \le l \le L-1$), the division unit 101 inputs a data bit sequence 10-1. The data bit sequence 10-1 corresponds to $(u_1^{(l)}, u_2^{(l)})$. The division unit 101 divides the data bit sequence 10-1 into a first data bit sequence 11-1 and a second data bit sequence 12-1 for the $1^{th}$ section. The first data bit sequence 11-1 corresponds to $u_1^{(l)}$. The second data bit sequence 12-1 corresponds to $u_2^{(l)}$. The division unit 101 outputs the first data bit sequence 11-1 to the matrix calculation unit 102. The division unit 101 outputs the second data bit sequence 12-1 to the matrix calculation unit 103.

For the $1^{th}$ section ($1 \le l \le L-1$), the matrix calculation unit 102 inputs the first data bit sequence 11-1 from the division unit 101. As shown above in Equations (20) and (22), the matrix calculation unit 102 multiplies the first data bit sequence 11-1 by $(C^{(l)})^{-1}$ to obtain a punctured parity bit sequence 13-1 for a section l. The punctured parity bit sequence 13-1 corresponds to $v^{(l)}$. The matrix calculation unit 102 outputs the punctured parity bit sequence 13-1 to the matrix calculation unit 104. Moreover, for the first section to the $L-2^{th}$ sections, the matrix calculation unit 102 outputs punctured parity bit sequences 13-1, . . . , 13-(L−2), respectively, to the matrix calculation unit 107. For the $L-1^{th}$ section, the matrix calculation unit 102 outputs a punctured parity bit sequence 13-(L−1) to the matrix calculation unit 111.

For the $1^{th}$ section ($1 \le l \le L-1$), the matrix calculation unit 103 inputs the second data bit sequence 12-1 from the division unit 101. As shown above in Equations (21) and (23), the matrix calculation unit 103 multiplies the second data bit sequence 12-1 by $E^{(l)}$ to obtain a first intermediary vector for the $1^{th}$ section. The matrix calculation unit 103 outputs the first intermediary vector for the $1^{th}$ section to the vector addition unit 105.

For the $1^{th}$ section ($1 \le l \le L-1$), the matrix calculation unit 104 inputs the punctured parity bit sequence 13-1 from the matrix calculation unit 102. As shown above in Equations (21) and (23), the matrix calculation unit 104 multiplies the punctured parity bit sequence 13-1 by $A^{(l)}$ to obtain a second intermediary vector for the section l. The matrix calculation unit 104 outputs the second intermediary vector for the section l to the vector addition unit 105.

For the first section, the vector addition unit 105 inputs a first intermediary vector for the first section from the matrix calculation unit 103, and also inputs a second intermediary vector for the first section from the matrix calculation unit 104. As shown above in Equation (21), the vector addition unit 105 adds the first intermediary vector and the second intermediary vector together to obtain a third intermediary vector for the first section. The vector addition unit 105 outputs the third intermediary vector to the matrix calculation unit 106.

For the $1^{th}$ section ($2 \le l \le L-1$), the vector addition unit 105 inputs a first intermediary vector for the $1^{th}$ section from the matrix calculation unit 103, and also inputs a second intermediary vector for the $1^{th}$ section from the matrix calculation unit 104. As described below, the vector addition unit 105 further inputs a fourth intermediary vector for the $l-1^{th}$ section from the delay unit 108, and also receives a fifth intermediary vector for the $l-1^{th}$ section from the delay unit 110. As shown above in Equation (23), the vector addition unit 105 adds the first intermediary vector, the second intermediary vector, the fourth intermediary vector, and the fifth intermediary vector together to obtain a third intermediary vector for the $1^{th}$ section. The vector addition unit 105 outputs the third intermediary vector to the matrix calculation unit 106.

For the $1^{th}$ section ($1 \le l \le L-1$), the matrix calculation unit 106 inputs a third intermediary vector for the $1^{th}$ section from the vector addition unit 105. As shown in Equations (21) and (23), the matrix calculation unit 106 multiplies the third intermediary vector by $(F^{(l)})^{-1}$ to generate an output parity bit sequence 14-1 for the $1^{th}$ section. The output parity bit sequence 14-1 corresponds to $w^{(l)}$. As described above, the output parity bit sequence 14-1 is supplied to the outside of the encoding apparatus 100 as a part of the output bit sequence for the $1^{th}$ section together with the data bit sequence 10-1. Moreover, for the first section to the $L-2^{th}$ section, the matrix calculation unit 106 supplies output parity bit sequences 14-1, . . . , 14-(L−2) to the matrix calculation unit 109. For the $L-1^{th}$ section, the matrix calculation unit 106 supplies an output parity bit sequence 14-(L−1) to the matrix calculation unit 113.

For the $1^{th}$ section ($1 \le l \le L-2$), the matrix calculation unit 107 inputs the punctured parity bit sequence 13-1 for the $1^{th}$ section from the matrix calculation unit 102. As shown above in Equation (23), the matrix calculation unit 107 multiplies the punctured parity bit sequence 13-1 by $P^{(l)}$ to obtain a fourth intermediary vector for the $1^{th}$ section. The matrix calculation unit 107 outputs the fourth intermediary vector to the delay unit 108. $P^{(l)}$ denotes a permutation matrix comprising only one non-zero element in each row. Thus, the matrix calculation unit 107 may be implemented using an interleaver.

For the $1^{th}$ section ($1 \le l \le L-2$), the delay unit 108 inputs the fourth intermediary vector for the $1^{th}$ section from the matrix calculation unit 107. The delay unit 108 provides a unit delay corresponding to one section to the fourth intermediary vector. For the $l+1^{th}$ section, the delay unit 108 outputs the fourth intermediary vector for the $1^{th}$ section to the vector addition unit 105. The positions of the delay unit 108 and the matrix calculation unit 107 in the sequence may be changed to each other.

For the $l^{th}$ section ($1 \leq l \leq L-2$), the matrix calculation unit 109 inputs the punctured parity bit sequence 14-1 for the $l^{th}$ section from the matrix calculation unit 106. As shown above in Equation (23), the matrix calculation unit 109 multiplies the output parity bit sequence 14-1 by $Q^{(l)}$ to obtain a fifth intermediary vector for the $l^{th}$ section. The matrix calculation unit 109 outputs the fifth intermediary vector to the delay unit 110. $Q^{(l)}$ denotes a permutation matrix comprising only one non-zero element in each row. Thus, the matrix calculation unit 109 may be implemented using an interleaver.

For the $l^{th}$ section ($1 \leq l \leq L-2$), the delay unit 110 inputs the fifth intermediary vector for the $l^{th}$ section from the matrix calculation unit 109. The delay unit 110 provides a unit delay corresponding to one section to the fifth intermediary vector. For the $l+1^{th}$ section, the delay unit 110 outputs the fifth intermediary vector for the $l^{th}$ section to the vector addition unit 105. The positions of the delay unit 110 and the matrix calculation unit 109 in the sequence may be changed to each other.

For the $L-1^{th}$ section, the matrix calculation unit 111 inputs a punctured parity bit sequence 13-(L-1) for the $L-1^{th}$ section from the matrix calculation unit 102. As shown above in Equation (25), the matrix calculation unit 111 multiplies the punctured parity bit sequence 13-(L-1) by $P^{(L-1)}$ to obtain a fourth intermediary vector for the $L-1^{th}$ section. The matrix calculation unit 107 outputs the fourth intermediary vector to the delay unit 112. $P^{(L-1)}$ denotes a permutation matrix comprising only one non-zero element in each row. Thus, the matrix calculation unit 111 may be implemented using an interleaver.

For the $L-1^{th}$ section, the delay unit 112 inputs the fourth intermediary vector from the matrix calculation unit 111. The delay unit 112 provides a unit delay corresponding to one section to the fourth intermediary vector. For the $L^{th}$ section, the delay unit 112 outputs the fourth intermediary vector to the vector addition unit 115.

For the $L-1^{th}$ section, the matrix calculation unit 113 inputs an output parity bit sequence 14-(L-1) for the $L-1^{th}$ section from the matrix calculation unit 106. As shown above in Equation (25), the matrix calculation unit 113 multiplies the output parity bit sequence 14-(L-1) by $Q^{(L-1)}$ to obtain a fifth intermediary vector for the $L-1^{th}$ section. The matrix calculation unit 113 outputs the fifth intermediary vector to the delay unit 114. $Q^{(L-1)}$ denotes a permutation matrix comprising only one non-zero element in each row. Thus, the matrix calculation unit 113 may be implemented using an interleaver.

For the $L-1^{th}$ section, the delay unit 114 inputs the fifth intermediary vector from the matrix calculation unit 113. The delay unit 114 provides a unit delay corresponding to one section to the fifth intermediary vector. For the $L^{th}$ section, the delay unit 114 outputs the fifth intermediary vector to the vector addition unit 115.

For the $L^{th}$ section, the vector addition unit 115 inputs the fourth intermediary vector from the delay unit 112, and also inputs the fifth intermediary vector from the delay unit 114. As shown above in Equation (25), the vector addition unit 115 adds the fourth intermediary vector and the fifth intermediary vector together to obtain a sixth intermediary vector. The sixth intermediary vector corresponds to $S^{(L)}$. The vector addition unit 115 outputs the sixth intermediary vector to the matrix calculation unit 116.

For the $L^{th}$ section, the matrix calculation unit 116 inputs the sixth intermediary vector from the vector addition unit 115. As shown above in Equation (24), the matrix calculation unit 116 couples a zero vector comprising Z elements to the leading end of the sixth intermediary vector and couples a zero vector comprising kZ elements to the trailing end of the sixth intermediary vector to obtain a seventh intermediary vector. Moreover, as shown in Equation (24), the matrix calculation unit 116 multiplies the seventh intermediary vector by an inverse matrix of the matrix shown above in Equation (19) to generate an output parity bit sequence 14-L for the $L^{th}$ section. The output parity bit sequence 14-L for the $L^{th}$ section corresponds to $(w_1^{(L)}, w_2^{(L)})$. The output parity bit sequence 14-L is supplied to the outside of the encoding apparatus 100 as an output bit sequence for the $L^{th}$ section.

The positions of the delay unit 112 and the matrix calculation unit 111 in the sequence may be changed to each other. Similarly, the positions of the delay unit 114 and the matrix calculation unit 113 in the sequence may be changed to each other. Alternatively, the delay units 112 and 114 may be removed, and a functional unit may be provided which provides a unit delay corresponding to one section to the sixth intermediary vector or the output parity bit sequence 14-L.

The encoding apparatus according to the present embodiment can achieve various coding rates through design of the various parameters (k, r, g, e, L). Table 1 below shows an example of design of the parameters and the corresponding coding rates, decoding limits, and Shannon limits (theoretical limits). The decoding limit is indicative of the result of evaluation, by density evolution, of the maximum of decodable erasure probability on a binary erasure channel.

TABLE 1

| Parameter | Coding rate | Decoding limit | Shannon limit |
|---|---|---|---|
| (k = 2, r = 3, g = 2, e = 0, L = 64) | 1/3 | 0.66661 | 0.6666... |
| (k = 1, r = 3, g = 2, e = 0, L = 64) | 1/2 | 0.49999 | 0.5 |
| (k = 1, r = 3, g = 2, e = 1, L = 64) | 2/3 | 0.33331 | 0.3333... |

As is apparent from Table 1, the encoding apparatus according to the present embodiment can achieve iterative decoding performance that is close to the Shannon limit at various coding rates.

As described above, the encoding apparatus according to the first embodiment generates codewords defined by a parity check matrix obtained by performing a copy and permutation operation on a spatially-coupled matrix based on a fundamental matrix shown above in Equation (3) or the like. Thus, the encoding apparatus can generate systematic codes which achieve iterative decoding performance that is close to the Shannon limit. A decoding apparatus according to the present embodiment may carry out iterative decoding using, for example, the parity bit sequence shown above in Equation (16). Thus, the detailed description for the decoding apparatus is omitted.

Second Embodiment

The encoding apparatus and decoding apparatus according to the first embodiment are incorporated into, for example, a storage apparatus. A storage apparatus according to the second embodiment incorporates the encoding apparatus and decoding apparatus according to the first embodiment. The encoding apparatus and decoding apparatus according to the first embodiment may be incorporated into any apparatuses such as an optical recording apparatus and a magnetic recording apparatus which can utilize error correction coding.

Figure 7:
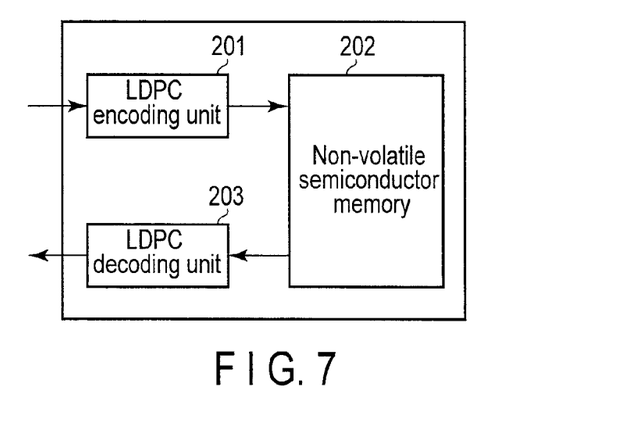
FIG. 7 is a block diagram illustrating a storage apparatus according to a second embodiment.

As shown in FIG. 7, a storage apparatus according to a second embodiment comprises an LDPC encoding unit 201, a non-volatile semiconductor memory 202, and an LDPC decoding unit 203. Furthermore, for simplification, a functional unit that writes and reads data to and from the non-volatile semiconductor memory 202 is omitted from FIG. 7. However, the storage apparatus may comprise such a functional unit as necessary.

The LDPC encoding unit 201 corresponds to the encoding apparatus according to the first embodiment. The LDPC encoding unit 201 inputs data from a processing unit (not shown in the drawings) located upstream of the LDPC encoding unit 201, and carries out an LDPC encoding process on a data bit sequence forming the data. That is, the LDPC encoding unit 201 adds a parity bit sequence (excluding a punctured parity bit sequence) to the data bit sequence to generate an LDPC code frame (that is, an output bit sequence). The LDPC encoding unit 201 carries out an encoding process utilizing the parity check matrix shown above in Equation (16). The LDPC encoding unit 201 bundles at least one LDPC code frames to form page data. The LDPC encoding unit 201 outputs the page data to the non-volatile semiconductor memory 202.

Write and read processes on the non-volatile semiconductor memory 202 are each carried out in units of page data. The page data is obtained by bundling at least one LDPC code frame. The size of the page data depends on the configuration of the non-volatile semiconductor memory 202 but is generally about several kilobytes. The non-volatile semiconductor memory 202 comprises a plurality of memory cells. Specifically, the non-volatile semiconductor memory 202 is implemented by, for example, a flash memory comprising an array structure in which a plurality of memory cells are connected together into NAND form.

Each of the memory cells is assigned with at least two threshold voltages and can store data of at least 1 bit. The amount of data that can be stored in each memory cell is determined by the total number of threshold voltages assigned to the memory cell. For example, for a flash memory that stores 2 bits per cell, four threshold values corresponding to patterns of 2-bit values: 00, 01, 10, and 11 are assigned to each of the cells. The threshold voltage of the memory cell may fluctuate owing to capacitive coupling with adjacent cells or the like. The fluctuation of the threshold voltage may cause errors in read data.

The non-volatile semiconductor memory 202 inputs page data generated by the LDPC encoding unit 201. The non-volatile semiconductor memory 202 stores the page data in a memory cell (writes the page data to the memory cell). Furthermore, the non-volatile semiconductor memory 202 reads the page data stored in the memory cell and outputs the page data. As described above, the page data may be read with an error due to a factor such as the fluctuation of the threshold voltage.

The LDPC decoding unit 203 corresponds to the decoding apparatus according to the first embodiment. The LDPC decoding unit 203 inputs page data read by the non-volatile semiconductor memory 202. The LDPC decoding unit 203 carries out a LDPC decoding process on each of at least one LDPC code frame included in the page data. The LDPC decoding process is implemented by an iterative decoding algorithm using a parity check matrix. The iterative decoding algorithm is, for example, a sum-product algorithm or a min-sum algorithm. The LDPC decoding unit 203 uses the parity check matrix shown above in Equation (16).

When a parity check results in the absence of errors (that is, decoding is successful), the LDPC decoding unit 203 removes a parity bit sequence from temporary estimated words to generate a data bit sequence. The LDPC decoding unit 203 then outputs the data bit sequence to a signal processing unit (not shown in the drawings) located downstream of the LDPC decoding unit 203. Furthermore, if the number of iterations of a decoding process reaches the maximum number of iterations (that is, decoding fails), LDPC decoding unit 203 may output the data bit sequence to the downstream signal processing unit (not shown in the drawings) or notify the downstream signal processing unit (not shown in the drawings) of the failure of the decoding.

As described above, the storage apparatus according to the second embodiment incorporates the encoding apparatus and decoding apparatus according to the first embodiment. Thus, the storage apparatus can demonstrate a powerful error correction capability during data reading.

Third Embodiment

Figure 8:
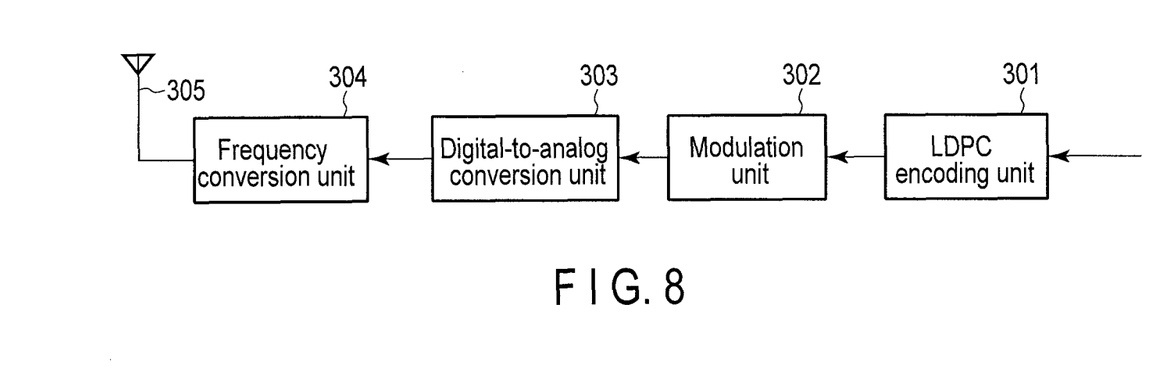
FIG. 8 is a block diagram illustrating a communication apparatus according to a third embodiment.

The encoding apparatus according to the first embodiment may be incorporated into a communication apparatus (transmitter or transceiver). As shown in FIG. 8, the communication apparatus according to the third embodiment comprises an LDPC encoding unit 301, a modulation unit 302, a digital-to-analog conversion unit 303, a frequency conversion unit 304, and an antenna 305. The communication apparatus in FIG. 8 is typically a wireless communication apparatus (which supports a cellular, a wireless local area network [LAN], or the like) (transmitter or transceiver), a broadcasting communication apparatus (transmitter or transceiver), or the like. Furthermore, although not shown in FIG. 8, the communication apparatus may comprise a power amplifier and a filter.

The LDPC encoding unit 301 corresponds to the encoding apparatus according to the first embodiment. The LDPC encoding unit 301 inputs data from a processing unit (not shown in the drawings) located upstream of the LDPC encoding unit 301 and carries out an LDPC encoding process on a data bit sequence forming the data. That is, the LDPC encoding unit 301 adds a parity bit sequence (excluding a punctured parity bit sequence) to the data bit sequence to generate an LDPC code frame (that is, an output bit sequence). The LDPC encoding unit 301 carries out an encoding process utilizing the parity check matrix shown above in Equation (16). The LDPC encoding unit 301 outputs LDPC code frames to the modulation unit 302.

The modulation unit 302 modulates the LDPC code frames. The digital-to-analog conversion unit 303 carries out a digital-to-analog conversion on a modulation signal from the modulation unit 302. The frequency conversion unit 304 up-converts a baseband transmission signal from the digital-to-analog conversion unit 303. The antenna 305 radiates an RF transmission signal from the frequency conversion unit 304.

Figure 9:
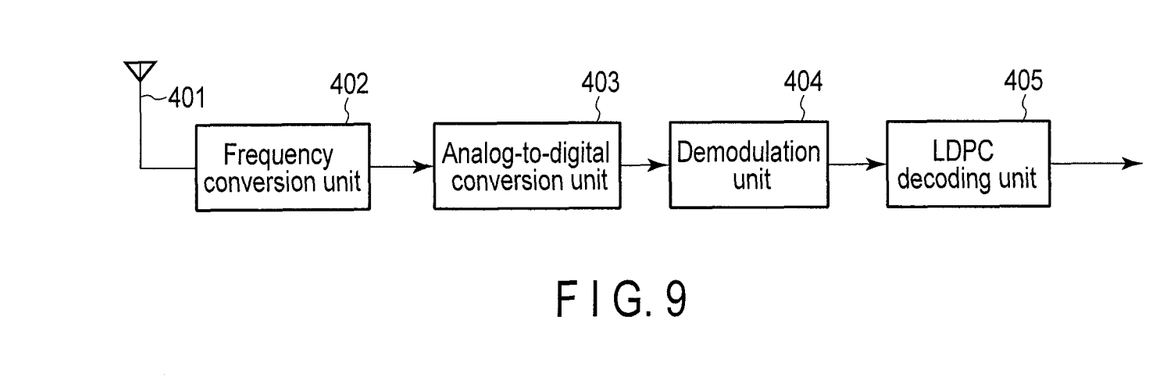
FIG. 9 is a block diagram illustrating a communication apparatus according to the third embodiment.

Furthermore, the communication apparatus (receiver or transceiver) may incorporate the decoding apparatus according to the first embodiment. As shown in FIG. 9, the communication apparatus according to the present embodiment comprises an antenna 401, a frequency conversion unit 402, an analog-to-digital conversion unit 403, a demodulation unit 404, and an LDPC decoding unit 405. The communication apparatus in FIG. 9 is typically a wireless communication apparatus (which supports a cellular, a wireless local area network [LAN], or the like) (receiver or transceiver), a broadcasting communication apparatus (receiver or transceiver), or the like. Furthermore, although not shown in FIG. 9, the communication apparatus may comprise a low-noise amplifier and a filter.

The antenna 401 receives high-frequency radio signals. The frequency conversion unit 402 down-converts an RF reception signal from the antenna 401. The analog-to-digital conversion unit 403 carries out an analog-to-digital conversion on a baseband reception signal from the frequency conversion unit 402. The demodulation unit 404 demodulates a digital signal from the analog-to-digital conversion unit 403 in accordance with the transmitter's modulation scheme.

The LDPC decoding unit 405 incorporates the decoding apparatus according to the first embodiment. The LDPC decoding unit 405 carries out an LDPC decoding process on demodulation data from the demodulation unit 404 to restore reception data. Specifically, the LDPC decoding process is realized by an iterative decoding algorithm using a parity check matrix. The iterative decoding algorithm is, for example, a sum-product algorithm or a min-sum algorithm. The LDPC decoding unit 405 uses the parity check matrix shown above in Equation (16).

As described above, the communication apparatus according to the third embodiment incorporates the encoding apparatus or decoding apparatus according to the above-described first embodiment. Thus, the communication apparatus can demonstrate a powerful error correction capability in the restoration of reception data.

The processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication apparatus comprising:
an encoding unit configured to encode a data bit sequence to generate a codeword corresponding to a parity check matrix;
a modulation unit configured to modulate the codeword to obtain a modulation signal;
a digital-to-analog conversion unit configured to carry out a digital-to-analog conversion on the modulation signal to obtain a baseband transmission signal; and
a frequency conversion unit configured to up-convert the baseband transmission signal to obtain an RF transmission signal, wherein:
the parity check matrix matches a matrix obtained by performing a copy and permutation operation on a spatially-coupled matrix,
the spatially-coupled matrix comprises L first matrices arranged in a diagonal direction, where L denotes an integer of at least 2,
elements in the spatially-coupled matrix other than the first matrices are all zero,
each of the first matrices comprises (d+1) expanded matrices coupled together in a row direction, where d denotes an integer of at least 1,
each of the expanded matrices is an $m_p$ rows×$n_p$ columns matrix, where $m_p$ denotes an integer of at least 2, and $n_p$ denotes an integer of at least 2,
a first total number of non-zero elements included in any row among $1^{st}$ to $m_p^{th}$ rows of the spatially-coupled matrix is smaller than a second total number of non-zero elements included in any row among $m_pd+1^{th}$ to $m_pL^{th}$ rows of the spatially-coupled matrix,
a third total number of non-zero elements included in any row among $m_p(L+d-1)+1^{th}$ to $m_p(L+d)^{th}$ rows of the spatially-coupled matrix is smaller than the second total number,
a summation of the expanded matrices is equal to a fundamental matrix,
the fundamental matrix corresponds to a protograph comprising n check nodes of a first type, n check nodes of a second type, n variable nodes of a first type, n variable nodes of a second type, n variable nodes of a third type, at least n edges of a first type, at least 2n edges of a second type, rn edges of a third type, and gn edges of a fourth type, where n denotes an integer of at least 1, r denotes an integer of at least 3, and g denotes an integer of at least 2,
in the protograph, each of the n check nodes of the first type is connected to the n variable nodes of the first type by a total of at least one edge of the first type, and to the n variable nodes of the second type by a total of at least two edges of the second type,
in the protograph, each of the n check nodes of the second type is connected to the n variable nodes of the second type by a total of r edges of the third type, and to the n variable nodes of the third type by a total of g edges of the fourth type,
in the protograph, each of the n variable nodes of the first type is connected to the n check nodes of the first type by a total of at least one edge of the first type,
in the protograph, each of the n variable nodes of the second type is connected to the n check nodes of the first type by a total of at least two edges of the second type, and to the n check nodes of the second type by a total of r edges of the third type, and
in the protograph, each of the n variable nodes of the third type is connected to the n check nodes of the second type by a total of g edges of the fourth type.

2. The apparatus according to claim 1, wherein:
the protograph further comprises n check nodes of an $i+1^{th}$ type, n variable nodes of an $i+2^{th}$ type, rn edges of a $2i+1^{th}$ type, and gn edges of a $2i+2^{th}$ type, where i means all integers of at least 2 and at most k and k means any integer of at least 2,
in the protograph, each of the n check nodes of the $i+1^{th}$ type is connected to the n variable nodes of the second type by a total of r edges of the $2i+1^{th}$ type, and to the n variable nodes of the $i+2^{th}$ type by a total of g edges of the $2i+2^{th}$ type, in the protograph, each of the n variable nodes of the i+2$^{th}$ type is connected to the n check nodes of the i+1$^{th}$ type by a total of g edges of the 2i+2$^{th}$ type, and in the protograph, each of the n variable nodes of the second type is further connected to the n check nodes of the i+1$^{th}$ type by a total of r edges of the 2i+1$^{th}$ type.

3. The apparatus according to claim 1, wherein:

the protograph further comprises n variable nodes of an i+3$^{th}$ type, and rn edges of an i+4$^{th}$ type, where i means all integers of at least 1 and at most e, and e means any integer of at least 1, in the protograph, each of the n variable nodes of the i+3$^{th}$ type is connected to the n check nodes of the second type by a total of r edges of the i+4$^{th}$ type, and in the protograph, each of the n check nodes of the second type is further connected to the n variable nodes of the i+3$^{th}$ type by a total of r edges of the i+4$^{th}$ type.

4. The apparatus according to claim 1, wherein r=3 and g=2.

5. The apparatus according to claim 1, wherein:

in the protograph, each of the n check nodes of the first type is connected to the n variable nodes of the first type by a total of one edge of the first type, and to the n variable nodes of the second type by a total of two edges of the second type, in the protograph, each of the n variable nodes of the first type is connected to the n check nodes of the first type by a total of one edge of the first type, and in the protograph, each of the n variable nodes of the second type is connected to the n check nodes of the first type by a total of two edges of the second type.

6. The apparatus according to claim 1, wherein the encoding unit comprises:

a division unit configured to divide the data bit sequence into first to (L−1)$^{th}$ sections in time series;

a first local encoding unit configured to encode the first section to obtain a first sub-codeword, and to encode each of the second to (L−1)$^{th}$ sections by using encoding result of previous section to obtain each of second to (L−1)$^{th}$ sub-codewords; and a second local encoding unit configured to encode encoding result of the (L−1)$^{th}$ section to generate an L$^{th}$ sub-codeword;

the codeword is composed of the first to L$^{th}$ sub-codewords.

7. A communication apparatus comprising:

an encoding unit configured to encode a data bit sequence to generate a codeword corresponding to a parity check matrix;

a modulation unit configured to modulate the codeword to obtain a modulation signal;

a digital-to-analog conversion unit configured to carry out a digital-to-analog conversion on the modulation signal to obtain a baseband transmission signal; and a frequency conversion unit configured to up-convert the baseband transmission signal to obtain an RF transmission signal, wherein:

the parity check matrix matches a matrix obtained by performing a copy and permutation operation on a spatially-coupled matrix, the spatially-coupled matrix comprises L first matrices arranged in a diagonal direction, where L denotes an integer of at least 2, elements in the spatially-coupled matrix other than the first matrices are all zero, each of the first matrices comprises (d+1) expanded matrices coupled together in a row direction, where d denotes an integer of at least 1, each of the expanded matrices is an $m_p$ rows×$n_p$ columns matrix, where $m_p$ denotes an integer of at least 2, and $n_p$ denotes an integer of at least 2, a first total number of non-zero elements included in any row among $1^{st}$ to $m_p^{th}$ rows of the spatially-coupled matrix is smaller than a second total number of non-zero elements included in any row among $m_p d+1^{th}$ to $m_p L^{th}$ rows of the spatially-coupled matrix, a third total number of non-zero elements included in any row among $m_p(L+d-1)+1^{th}$ to $m_p(L+d)^{th}$ rows of the spatially-coupled matrix is smaller than the second total number, a summation of the expanded matrices is equal to a fundamental matrix, the fundamental matrix corresponds to a protograph comprising a check node of a first type, a check node of a second type, a variable node of a first type, a variable node of a second type, a variable node of a third type, at least one edge of a first type, at least two edges of a second type, r edges of a third type, and g edges of a fourth type, where r denotes an integer of at least 3, and g denotes an integer of at least 2, in the protograph, the check node of the first type is connected to the variable node of the first type by the at least one edge of the first type, and to the variable node of the second type by the at least two edges of the second type, and in the protograph, the check node of the second type is connected to the variable node of the second type by the r edges of the third type, and to the variable node of the third type by the g edges of the fourth type.

8. The apparatus according to claim 7, wherein:

the protograph further comprises a check node of an i+1$^{th}$ type, a variable node of an i+2$^{th}$ type, r edges of a 2i+1$^{th}$ type, and g edges of a 2i+2$^{th}$ type, where i means all integers of at least 2 and at most k and k means any integer of at least 2, in the protograph, the check node of the i+1$^{th}$ type is connected to the variable node of the second type by the r edges of the 2i+1$^{th}$ type, and to the variable node of the i+2$^{th}$ type by the g edges of the 2i+2$^{th}$ type, in the protograph, the variable node of the i+2$^{th}$ type is connected to the check node of the i+1$^{th}$ type by the g edges of the 2i+2$^{th}$ type, and in the protograph, the variable node of the second type is further connected to the check node of the i+1$^{th}$ type by the r edges of the 2i+1$^{th}$ type.

9. The apparatus according to claim 7, wherein:

the protograph further comprises a variable node of an i+3$^{th}$ type, and r edges of an i+4$^{th}$ type, where i means all integers of at least 1 and at most e, and e means any integer of at least 1, in the protograph, the variable node of the i+3$^{th}$ type is connected to the check node of the second type by the r edges of the i+4$^{th}$ type, and in the protograph, the check node of the second type is further connected to the variable node of the i+3$^{th}$ type by the r edges of the i+4$^{th}$ type.

10. The apparatus according to claim 7, wherein r=3 and g=2.

11. The apparatus according to claim 7, wherein:

in the protograph, the check node of the first type is connected to the variable node of the first type by one edge of the first type, and to the variable node of the second type by two edges of the second type, in the protograph, the variable node of the first type is connected to the check node of the first type by one edge of the first type, and in the protograph, the variable node of the second type is connected to the check node of the first type by two edges of the second type.

12. The apparatus according to claim 7, wherein:

the expanded matrices comprise a first expanded matrix and a second expanded matrix, the protograph corresponding to the fundamental matrix is equal to a summation of a first partial protograph corresponding to the first expanded matrix and a second partial protograph corresponding to the second expanded matrix, in the first partial protograph, the check node of the second type is connected to the variable node of the second type by one edge of the third type, and to the variable node of the third type by one edge of the fourth type, in the second partial protograph, the check node of the first type is connected to the variable node of the first type by the at least one edge of the first type, and to the variable node of the second type by the at least two edges of the second type, and in the second partial protograph, the check node of the second type is connected to the variable node of the second type by r−1 edges of the third type, and to the variable node of the third type by g−1 edges of the fourth type.

13. A storage apparatus comprising:

an encoding unit configured to encode a data bit sequence to generate a codeword corresponding to a parity check matrix; and a non-volatile computer-readable memory configured to store computer-readable data corresponding to the generated codeword, wherein:

the non-volatile computer-readable memory comprises an array structure in which a plurality of memory cells are connected together, wherein each of the memory cells is assigned with at least two threshold voltages and can store data of at least 1 bit, and the non-volatile computer-readable memory stores the generated codeword in the memory cells as page data output by the encoding unit, the parity check matrix matches a matrix obtained by performing a copy and permutation operation on a spatially-coupled matrix, the spatially-coupled matrix comprises L first matrices arranged in a diagonal direction, where L denotes an integer of at least 2, elements in the spatially-coupled matrix other than the first matrices are all zero, each of the first matrices comprises (d+1) expanded matrices coupled together in a row direction, where d denotes an integer of at least 1, each of the expanded matrices is an $m_p$ rows×$n_p$ columns matrix, where $m_p$ denotes an integer of at least 2, and $n_p$ denotes an integer of at least 2, a first total number of non-zero elements included in any row among $1^{st}$ to $m_p^{th}$ rows of the spatially-coupled matrix is smaller than a second total number of non-zero elements included in any row among $m_p d+1^{th}$ to $m_p L^{th}$ rows of the spatially-coupled matrix, a third total number of non-zero elements included in any row among $m_p(L+d-1)+1^{th}$ to $m_p(L+d)^{th}$ rows of the spatially-coupled matrix is smaller than the second total number, a summation of the expanded matrices is equal to a fundamental matrix, the fundamental matrix corresponds to a protograph comprising n check nodes of a first type, n check nodes of a second type, n variable nodes of a first type, n variable nodes of a second type, n variable nodes of a third type, at least n edges of a first type, at least 2n edges of a second type, rn edges of a third type, and gn edges of a fourth type, where n denotes an integer of at least 1, r denotes an integer of at least 3, and g denotes an integer of at least 2, in the protograph, each of the n check nodes of the first type is connected to the n variable nodes of the first type by a total of at least one edge of the first type, and to the n variable nodes of the second type by a total of at least two edges of the second type, in the protograph, each of the n check nodes of the second type is connected to the n variable nodes of the second type by a total of r edges of the third type, and to the n variable nodes of the third type by a total of g edges of the fourth type, in the protograph, each of the n variable nodes of the first type is connected to the n check nodes of the first type by a total of at least one edge of the first type, in the protograph, each of the n variable nodes of the second type is connected to the n check nodes of the first type by a total of at least two edges of the second type, and to the n check nodes of the second type by a total of r edges of the third type, and in the protograph, each of the n variable nodes of the third type is connected to the n check nodes of the second type by a total of g edges of the fourth type.

14. The apparatus according to claim 13, wherein the protograph further comprises n check nodes of an $i+1^{th}$ type, n variable nodes of an $i+2^{th}$ type, rn edges of a $2i+1^{th}$ type, and gn edges of a $2i+2^{th}$ type, where i means all integers of at least 2 and at most k and k means any integer of at least 2, in the protograph, each of the n check nodes of the $i+1^{th}$ type is connected to the n variable nodes of the second type by a total of r edges of the $2i+1^{th}$ type, and to the n variable nodes of the $i+2^{th}$ type by a total of g edges of the $2+2^{th}$ type, in the protograph, each of the n variable nodes of the $i+2^{th}$ type is connected to the n check nodes of the $i+1^{th}$ type by a total of g edges of the $2i+2^{th}$ type, and in the protograph, each of the n variable nodes of the second type is further connected to the n check nodes of the $i+1^{th}$ type by a total of r edges of the $2i+1^{th}$ type.

15. The apparatus according to claim 13, wherein the protograph further comprises n variable nodes of an i+3th type, and rn edges of an i+4th type, where i means all integers of at least 1 and at most e, and e means any integer of at least 1, in the protograph, each of the n variable nodes of the $i+3^{th}$ type is connected to the n check nodes of the second type by a total of r edges of the $i+4^{th}$ type, and in the protograph, each of the n check nodes of the second type is further connected to the n variable nodes of the i+3th type by a total of r edges of the i+4th type.

16. The apparatus according to claim 13, wherein r=3 and g=2.

17. The apparatus according to claim 13, wherein in the protograph, each of the n check nodes of the first type is connected to the n variable nodes of the first type by a total of one edge of the first type, and to the n variable nodes of the second type by a total of two edges of the second type, in the protograph, each of the n variable nodes of the first type is connected to the n check nodes of the first type by a total of one edge of the first type, and in the protograph, each of the n variable nodes of the second type is connected to the n check nodes of the first type by a total of two edges of the second type.

18. A communication method for a communication apparatus comprising an encoding unit, a modulation unit, a digital-to-analog conversion unit, and a frequency conversion unit, the communication method comprising:

encoding, by the encoding unit, a data bit sequence to generate a codeword corresponding to a parity check matrix;

modulating, by the modulation unit, the codeword to obtain a modulation signal;

carrying out, by a digital-to-analog conversion unit, a digital-to-analog conversion on the modulation signal to obtain a baseband transmission signal; and up-converting, by a frequency conversion unit, the baseband transmission signal to obtain an RF transmission signal, wherein:

the parity check matrix matches a matrix obtained by performing a copy and permutation operation on a spatially-coupled matrix, the spatially-coupled matrix comprises L first matrices arranged in a diagonal direction, where L denotes an integer of at least 2, elements in the spatially-coupled matrix other than the first matrices are all zero, each of the first matrices comprises (d+1) expanded matrices coupled together in a row direction, where d denotes an integer of at least 1, each of the expanded matrices is an $m_p$ rows×$n_p$ columns matrix, where $m_p$ denotes an integer of at least 2, and $n_p$ denotes an integer of at least 2, a first total number of non-zero elements included in any row among $1^{st}$ to $m_p^{th}$ rows of the spatially-coupled matrix is smaller than a second total number of non-zero elements included in any row among $m_p d+1^{th}$ to $m_p L^{th}$ rows of the spatially-coupled matrix, a third total number of non-zero elements included in any row among $m_p(L+d-1)+1^{th}$ to $m_p(L+d)^{th}$ rows of the spatially-coupled matrix is smaller than the second total number, a summation of the expanded matrices is equal to a fundamental matrix, the fundamental matrix corresponds to a protograph comprising n check nodes of a first type, n check nodes of a second type, n variable nodes of a first type, n variable nodes of a second type, n variable nodes of a third type, at least n edges of a first type, at least 2n edges of a second type, rn edges of a third type, and gn edges of a fourth type, where n denotes an integer of at least 1, r denotes an integer of at least 3, and g denotes an integer of at least 2, in the protograph, each of the n check nodes of the first type is connected to the n variable nodes of the first type by a total of at least one edge of the first type, and to the n variable nodes of the second type by a total of at least two edges of the second type, in the protograph, each of the n check nodes of the second type is connected to the n variable nodes of the second type by a total of r edges of the third type, and to the n variable nodes of the third type by a total of g edges of the fourth type, in the protograph, each of the n variable nodes of the first type is connected to the n check nodes of the first type by a total of at least one edge of the first type, in the protograph, each of the n variable nodes of the second type is connected to the n check nodes of the first type by a total of at least two edges of the second type, and to the n check nodes of the second type by a total of r edges of the third type, and in the protograph, each of the n variable nodes of the third type is connected to the n check nodes of the second type by a total of g edges of the fourth type.

\* \* \* \* \*